United States Patent
Imai

(10) Patent No.: US 8,431,882 B2
(45) Date of Patent: Apr. 30, 2013

(54) LIGHT-RECEIVING CIRCUIT AND SEMICONDUCTOR DEVICE HAVING SAME

(75) Inventor: Hitoshi Imai, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 379 days.

(21) Appl. No.: 12/805,049

(22) Filed: Jul. 8, 2010

(65) Prior Publication Data

US 2011/0032004 A1 Feb. 10, 2011

(30) Foreign Application Priority Data

Aug. 6, 2009 (JP) ................. 2009-183501

(51) Int. Cl.
*H02M 11/00* (2006.01)
*H01L 31/101* (2006.01)

(52) U.S. Cl.
USPC ............... 250/214 A; 250/214 AL; 250/208.1

(58) Field of Classification Search ............... 250/214 A, 250/208.1, 208.2, 214 R
See application file for complete search history.

(56) References Cited

U.S. PATENT DOCUMENTS 7,763,838 B2 * 7/2010 Suzuki et al. ............. 250/214 A

FOREIGN PATENT DOCUMENTS

| JP | 2006-101110 A | 4/2006 |
| JP | 2006-250884 A | 9/2006 |

OTHER PUBLICATIONS

Notice of Grounds for Rejection with English translation dated Feb. 5, 2013.

* cited by examiner

*Primary Examiner* — Tony Ko
(74) *Attorney, Agent, or Firm* — McGinn IP Law Group, PLLC

(57) ABSTRACT

A light-receiving circuit includes a photodiode that converts an input optical signal to a current signal; a current-voltage converting circuit that outputs an output voltage signal obtained by adding a reference voltage to a voltage signal proportional to the current value of the current signal; and an input current limiting unit that supplies the current-voltage converting circuit with the current signal upon limiting the current value of this current signal based upon the reference voltage in such a manner that the output voltage signal will not exceed a constant value irrespective of the value of the reference voltage.

10 Claims, 7 Drawing Sheets

US 8,431,882 B2

LIGHT-RECEIVING CIRCUIT AND SEMICONDUCTOR DEVICE HAVING SAME

TECHNICAL FIELD

Reference to Related Application

This application is based upon and claims the benefit of the priority of Japanese patent application No. 2009-183501, filed on Aug. 6, 2009, the disclosure of which is incorporated herein in its entirety by reference thereto.

This invention relates to a light-receiving circuit and to a semiconductor device having this circuit. More particularly, the invention relates to circuit technology for limiting photocurrent.

BACKGROUND

Optical disk drives capable of data recording and playback using optical media such as CDs and DVDs have become widespread in recent years. A photoreceptor IC provided in the optical pickup within such an optical disk drive has a function for converting reflected laser light from a disk to current using a light-receiving circuit and converting the current to voltage using a current-voltage (I-V) converting circuit. Since the intensity of light that is input to the light-receiving element differs depending upon the operating conditions and there is a difference in laser output intensity conforming to the playback operation and a difference in the reflectivity of each optical disk, there are cases where the intensity becomes several times the saturation level of the output in the current-voltage converting circuit. To deal with this problem, Patent Document 1 discloses a current-voltage converting circuit for limiting input current in such a manner that excessive current will not be input to the current-voltage converting circuit.

FIG. 5 is a circuit diagram illustrating a current-voltage converting circuit described in Patent Document 1. The illustrated circuit arrangement is such that when photocurrent of a photodiode (light-receiving element) 102 becomes a large current that exceeds the output saturation level of a current-voltage converting circuit 101, the input current is limited in order to prevent an abnormal output response waveform that accompanies saturation of a transistor within the current-voltage converting circuit 101. More specifically, a constant-current circuit 111, current mirror circuits 109 and 110, and an NPN transistor 108 for dealing with superfluous current are provided between the light-receiving element 102 and the current-voltage converting circuit 101.

If an optical current ascribable to the light-receiving element 102 does not exist, the current values of the current mirror circuits 109 and 110 driven by the constant-current circuit 111 are equal and therefore the input current to the current-voltage converting circuit 101 is zero. On the other hand, if an optical current ascribable to the light-receiving element 102 is produced, this optical current flows into the current mirror circuit 109. As a result, the current of the current mirror circuit 109 increases in comparison with the current mirror circuit 110 and the difference current becomes the input to the current-voltage converting circuit 101.

As a result of the foregoing, a voltage drop across a resistor 104 is decided by the value of the current that flows through the current mirror circuit 109, namely by the sum of the current value decided by the constant-current circuit 111 and current mirror circuit 110 and the optical current. If the voltage drop across the resistor 104 increases owing to an increase in the optical current, the NPN transistor 108 is turned on by a certain optical current value, the optical current is diverted and the inflow of current to the current mirror circuit 109 is limited. By virtue of this operation, the input current to the current-voltage converting circuit 101 is limited to a value less than the optical current value at which the NPN transistor 108 turns on attendant upon the voltage drop across the resistor 104.

[Patent Document 1]
Japanese Patent Kokai Publication No. JP-P2006-101110A

SUMMARY

The entire disclosure of Patent Document 1 is incorporated herein by reference thereto.

The analysis set forth below is given in the present invention.

Preferably, a photoreceptor IC is capable of being used in common for various devices. Accordingly, it is preferred that the current-voltage converting circuit 101 be capable of adjusting and using a reference voltage applied to the non-inverting terminal (+), by way of example. In this case, the output voltage range varies in dependence upon the reference voltage. In FIG. 5, the limit value of the input optical current is decided solely by the resistor 104 and base-emitter voltage VBE of the NPN transistor 108 and therefore the current limit value cannot be controlled in accordance with the output voltage range.

FIG. 6 illustrates the relationship between the optical input current and output voltage in the circuit of FIG. 5. As described above, when the output range of the current-voltage converting circuit 101 is narrowed by a rise in the reference voltage of the current-voltage converting circuit 101, the limit current value stays at a constant value. Accordingly, there is a possibility that the output voltage of the current-voltage converting circuit will exceed the voltage at which the transistor within the current-voltage converting circuit saturates.

FIG. 7 illustrates an example of a pulse response characteristic at the time of output saturation in a case where the reference voltage has been raised. FIG. 7 shows that with a rise in the reference voltage, waveform delay occurs from a certain reference voltage value owing to saturation of the transistor within the current-voltage converting circuit. Thus there is much to be desired in the art.

According to one aspect of the present disclosure, there is provided a light-receiving circuit comprising: a light-receiving element that converts an input optical signal to a current signal; a current-voltage converting circuit that outputs an output voltage signal obtained by adding a reference voltage to a voltage signal proportional to the current value of the current signal; and an input current limiting unit that supplies the current-voltage converting circuit with the current signal upon limiting the current value of this current signal based upon the reference voltage in such a manner that the output voltage signal will not exceed a constant value irrespective of the value of the reference voltage.

The meritorious effects of the present disclosure are summarized as follows.

In accordance with the present disclosure, it is possible to obtain an excellent restoration characteristic regarding restoration from an excessive optical input of the kind that results in output saturation. Other features and advantages of the invention will be apparent from the following description taken in conjunction with the accompanying drawings, in which like reference characters designate the same or similar parts throughout the figures thereof.

PREFERRED MODES

Figure 1:
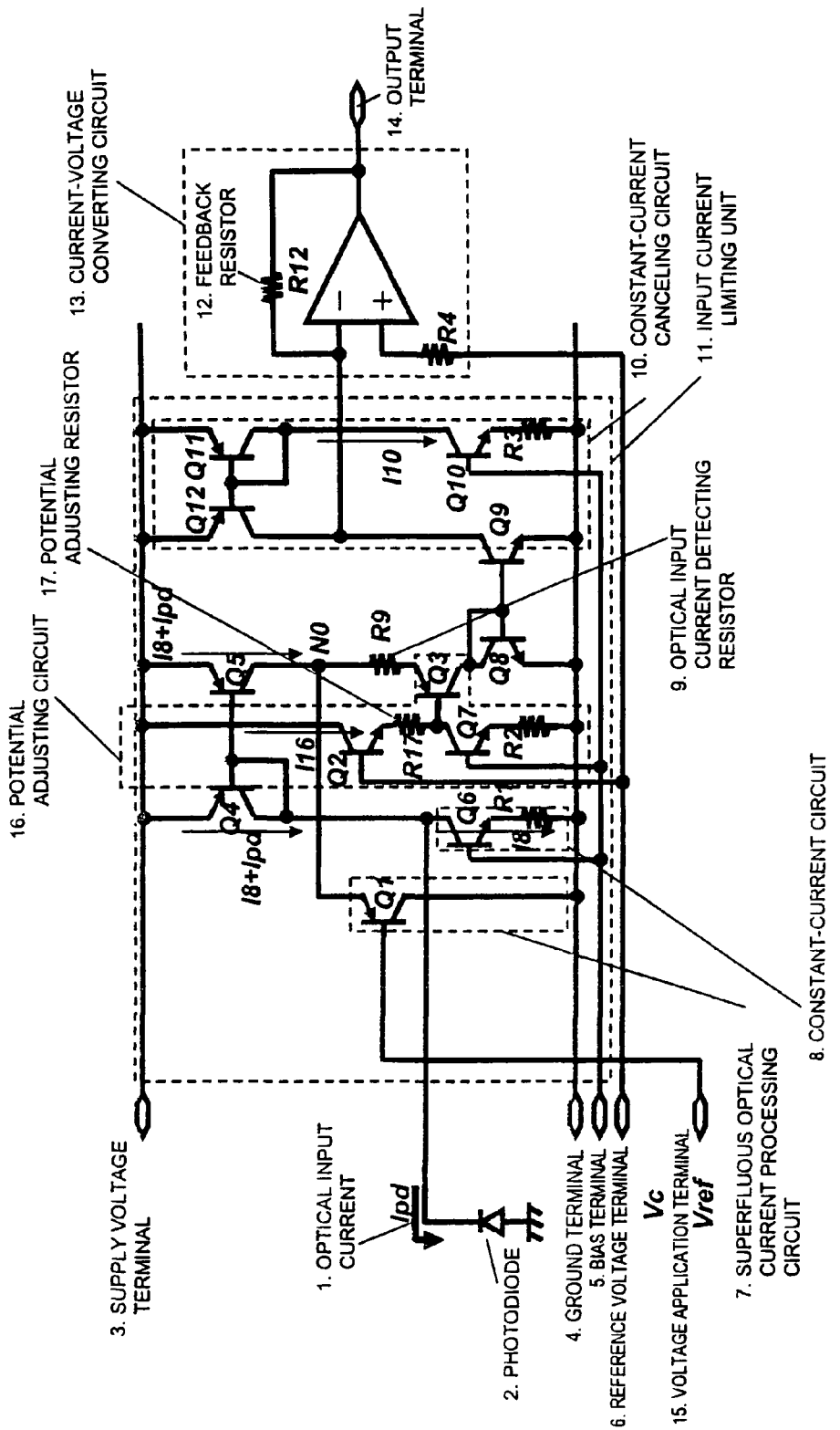
FIG. 1 is a circuit diagram of a light-receiving circuit according to a first exemplary embodiment of the present invention.

A light-receiving circuit according to the present invention comprises: a light-receiving element 2 (FIG. 1) that converts an input optical signal to a current signal; a current-voltage converting circuit 13 (FIG. 1) that outputs an output voltage signal obtained by adding a reference voltage to a voltage signal proportional to the current value of the current signal; and an input current limiting unit 11 (FIG. 1) that supplies the current-voltage converting circuit with the current signal upon limiting the current value of this current signal based upon the reference voltage in such a manner that the output voltage signal will not exceed a constant value irrespective of the value of the reference voltage.

Preferably, in a case where the current value of the current signal is equal to or greater than a limit value, the input current limiting unit limits the current value relating to the current signal, which is supplied to the current-voltage converting circuit, in such a manner that the current-voltage converting circuit will output a constant output voltage signal.

The input current limiting unit includes: a first resistance element 17 (FIG. 1) having a first end whose potential is decided by the reference voltage; and a second resistance element 9 (FIG. 1) having a first end whose potential is decided by the potential at a second end of the first resistance element; wherein the input current limiting unit passes a constant current into the first resistance element, passes a current obtained by adding the current of the current signal to the constant current into the second resistance element and limits the current value of the current signal based upon whether the potential at a second end of the second resistance element has exceeded a prescribed potential.

The input current limiting unit may further include a superfluous optical current processing circuit 7 (FIG. 1) that compares a voltage at the second end of the second resistance element and a voltage relating to the limit current of the current signal, and diverts a superfluous amount of current that exceeds the limit on the current value of the current signal.

The current-voltage converting circuit may include a feedback resistance provided between an output end that outputs the output voltage signal and an input end to which the current signal that is output from the input current limiting unit is input; wherein the feedback resistance is adapted so as to make possible changeover of the gain of the current-voltage converting circuit; and the input current limiting unit is adapted so as to change over resistance values of the first and second resistance elements in operative association with changeover of the feedback resistance.

A semiconductor device may be equipped with the light-receiving circuit described above.

In accordance with the light-receiving circuit described above, the limit value of the input current of the current-voltage converting circuit is linked to the reference voltage, whereby the output voltage limit value is made a constant voltage even when the reference voltage fluctuates. As a result, transistors within the circuit are caused to operate stably irrespective of the reference voltage of the current-voltage converting circuit, thereby making it possible to obtain an excellent restoration characteristic regarding restoration from an excessive optical input of the kind that results in output saturation.

Exemplary embodiments of the present disclosure will now be described in detail with reference to the drawings.

[First Exemplary Embodiment]

FIG. 1 is a circuit diagram of a light-receiving circuit according to a first exemplary embodiment of the present disclosure. The light-receiving circuit of FIG. 1 includes an input current limiting unit 11 provided between a photodiode 2, to which light is input and which converts the light to an optical input current 1, and a current-voltage converting circuit 13.

The input current limiting unit 11 includes a superfluous optical current processing circuit 7; an optical input current detecting resistor 9; a constant-current canceling circuit 10 for canceling idling current; a potential adjusting circuit 16; PNP transistors Q4, Q5 constructing a current mirror circuit; and NPN transistors Q8, Q9 constructing another current mirror circuit.

The superfluous optical current processing circuit 7 has a PNP transistor Q1. The PNP transistor Q1 has a collector connected to ground (GND terminal 4), a base connected to a voltage application terminal 15 and an emitter connected to a node N0. If the potential at the node N0 rises above a value obtained by adding the emitter-base voltage of the PNP transistor Q1 to a potential Vref at the voltage application terminal 15, then the PNP transistor Q1 diverts current from the node N0 to ground.

A constant-current circuit 8 has an NPN transistor Q6 and a resistance element R1. The NPN transistor Q6 has a collector connected to the cathode of the photodiode 2 whose anode is connected to ground, a base connected to a bias terminal 5 and an emitter connected to ground via the resistance element R1. A current 18 decided by the voltage at the bias terminal 5 and the resistance value of the resistance element R1 flows into the NPN transistor Q6.

The potential adjusting circuit 16 includes NPN transistors Q2, Q7, a PNP transistor Q3, a resistance element R2 and a potential adjusting resistor 17 (resistance element R17). The NPN transistor Q2 has a collector connected to a supply voltage terminal 3, a base connected to a reference voltage terminal 6 and an emitter connected to a first end of the resistance element R17. The NPN transistor Q7 has a collector connected to a second end of the resistance element R17 and to the base of the PNP transistor Q3, a base connected to the bias terminal 5 and an emitter connected to ground via the resistance element R2. A current I16 decided by the voltage at the bias terminal 5 and the resistance value of the resistance element R2 flows into the resistance elements R17 and R2.

The PNP transistor Q4 has an emitter connected, together with the emitter of the PNP transistor Q5, to the supply voltage terminal 3, a base connected to its own collector and to the base of the PNP transistor Q5, thereby constructing a current mirror circuit together with the PNP transistor Q5, and the collector, which is connected to the cathode of the photodiode 2. The PNP transistor Q5 has its collector connected to the emitter of the PNP transistor Q3 via the node N0 and optical input current detecting resistor 9 (resistance element R9). A current that is the sum of optical input current 1 (Ipd) and current 18 flows into the PNP transistors Q4, Q5, resistance element R9 and PNP transistor Q3.

The NPN transistor Q8 has an emitter connected, together with the emitter of the NPN transistor Q9, to ground, a base connected to its own collector and to the base of the NPN transistor Q9, thereby constructing a current mirror circuit together with the NPN transistor Q9, and the collector, which is connected to the collector of PNP transistor Q3. The NPN transistor Q9 has its collector connected to the inverting terminal (−) of an amplifier AMP. The current that is the sum of the optical input current 1 (Ipd) and current I8 flows into the NPN transistors Q8, Q9.

The constant-current canceling circuit 10 includes an NPN transistor Q10, PNP transistors Q11, Q12 and a resistance element R3. The NPN transistor Q10 has a collector connected to the collector of the NPN transistor Q11, a base connected to the bias terminal 5 and an emitted connected to ground via the resistance element R3. The PNP transistor Q11 has an emitter connected, together with the emitter of the PNP transistor Q12, to the supply voltage terminal 3, a base connected to its own collector and to the base of the PNP transistor Q12, thereby constructing a current mirror circuit together with the PNP transistor Q12. The PNP transistor Q12 has its collector connected to the inverting terminal (−) of an amplifier AMP. A current I10 decided by the voltage at the bias terminal 5 and the resistance value of the resistance element R3 flows into the NPN transistor Q10, resistance element R3 and NPN transistors Q10, Q11.

The current-voltage converting circuit 13 includes the amplifier AMP, a resistance element R4 and a feedback resistor (resistance element) R12. The amplifier AMP has an output end connected to an output terminal 14 and to its inverting terminal (−) via the resistance element R12, and has its non-inverting terminal (+) connected to the reference voltage terminal 6 via the resistance element R4. A current I8+Ipd−I10, which is the difference between the current that flows into the NPN transistor Q9 and the current that flows into the PNP transistor Q12, flows into the resistance element R12.

Now assume that the resistance values of the optical input current detecting resistor 9, feedback resistor 12 and potential adjusting resistor 17 are identical and that the current values of the constant-current circuit 8, potential adjusting circuit 16 and constant-current canceling circuit 10 are identical (I8=I16=I10).

Next, the operation of the light-receiving circuit constructed as set forth above will be described. The input current limiting unit 11 monitors the current value Ipd of the optical input current 1 based upon the potential difference of the optical input current detecting resistor 9. As the current value Ipd of the optical input current 1 increases, the potential at the emitter (node N0) of the PNP transistor Q1 of superfluous optical current processing circuit 7 rises. The PNP transistor Q1 turns on at a certain optical input current 1. After the PNP transistor Q1 turns on, the superfluous portion of the optical input current 1 is diverted through the PNP transistor Q1, whereby the input current to the current-voltage converting circuit 13 is limited.

The relationship among the potentials at various points in the circuit will now be described. The base potential, emitter potential and base-emitter voltage of each transistor Qn are represented by VBQn, VEQn and VBEQn, respectively.

If we assume that the potential at the reference voltage terminal 6 is Vc, then the emitter voltage VEQ1 of the PNP transistor Q1 is represented by Equation (1) below.

$$VEQ1=Vc-VBEQ2-I16 \times R17+VBEQ3+(I8+Ipd) \times R9 \qquad \text{Eq. (1)}$$

If R9=R17=R', I16=I8, VBEQ2=VBEQ3 holds in Equation (1), then Equation (1) becomes as follows:

$$VEQ1=Vc+Ipd \times R' \qquad \text{Eq. (2)}$$

The emitter voltage VEQ1 of the PNP transistor Q1 is represented by Equation (3) below assuming that the potential at the voltage application terminal 15 is Vref and that the PNP transistor Q1 is in the operating state.

$$VEQ1=Vref+VBEQ1 \qquad \text{Eq. (3)}$$

That Equations (2) and (3) be equal is a requirement for start of operation of the superfluous optical current processing circuit 7. In view of Equations (2) and (3), a limit value Ipdlim of the optical input current Ipdl is represented by Equation (4) below.

$$Ipdlim=(Vref+VBEQ1-Vc)/R' \qquad \text{Eq. (4)}$$

It will be understood from Equation (4) that by setting the potential Vref taking into consideration the fact that balance of the operating point of the transistor within the current-voltage converting circuit 13 not be disturbed, the limit value Ipdlim can be limited in operative association with the potential Vc at the reference voltage terminal 6.

Further, in view of the operating condition of the current-voltage converting circuit 13, a voltage limit value Vlim of the output terminal 14 is represented by the following equation:

$$Vlim=Vc+Ipdlim \times R12 \qquad \text{Eq. (5)}$$

If R12=R' holds, then Equation (6) below is obtained from Equations (4) and (5).

$$Vlim=Vref+VBEQ1 \qquad \text{Eq. (6)}$$

In accordance with Equation (6), the voltage limit value Vlim is decided by the potential Vref without dependence upon the potential Vc.

Further, the voltage Vout at the output terminal 14 is represented by the following equation where Vout<Vlim holds:

$$Vout=Vd+Ipd \times R12 \qquad \text{Eq. (7)}$$

Figure 2:
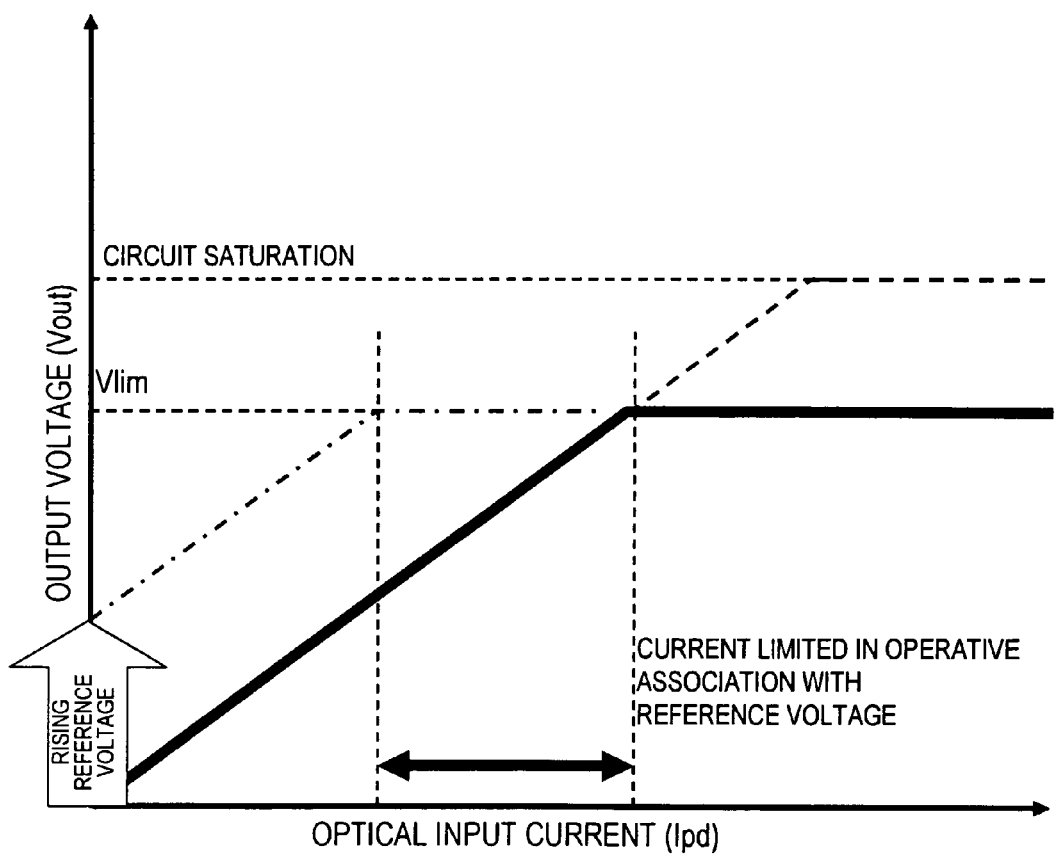
FIG. 2 is a diagram illustrating the input/output characteristic of the light-receiving circuit according to the first exemplary embodiment.

FIG. 2 is a diagram illustrating the relationship between the optical input current 1 (current value Ipd) and the voltage (voltage Vout) at the output terminal 14. Before the output of the current-voltage converting circuit 13 saturates, the input current limiting unit 11 limits the input current and changes this current limit value in operative association with the reference voltage Vc of the current-voltage converting circuit 13. Accordingly, as shown in FIG. 2, the limit value of the output voltage of current-voltage converting circuit 13 can be made constant (the voltage limit value Vlim).

Figure 3:
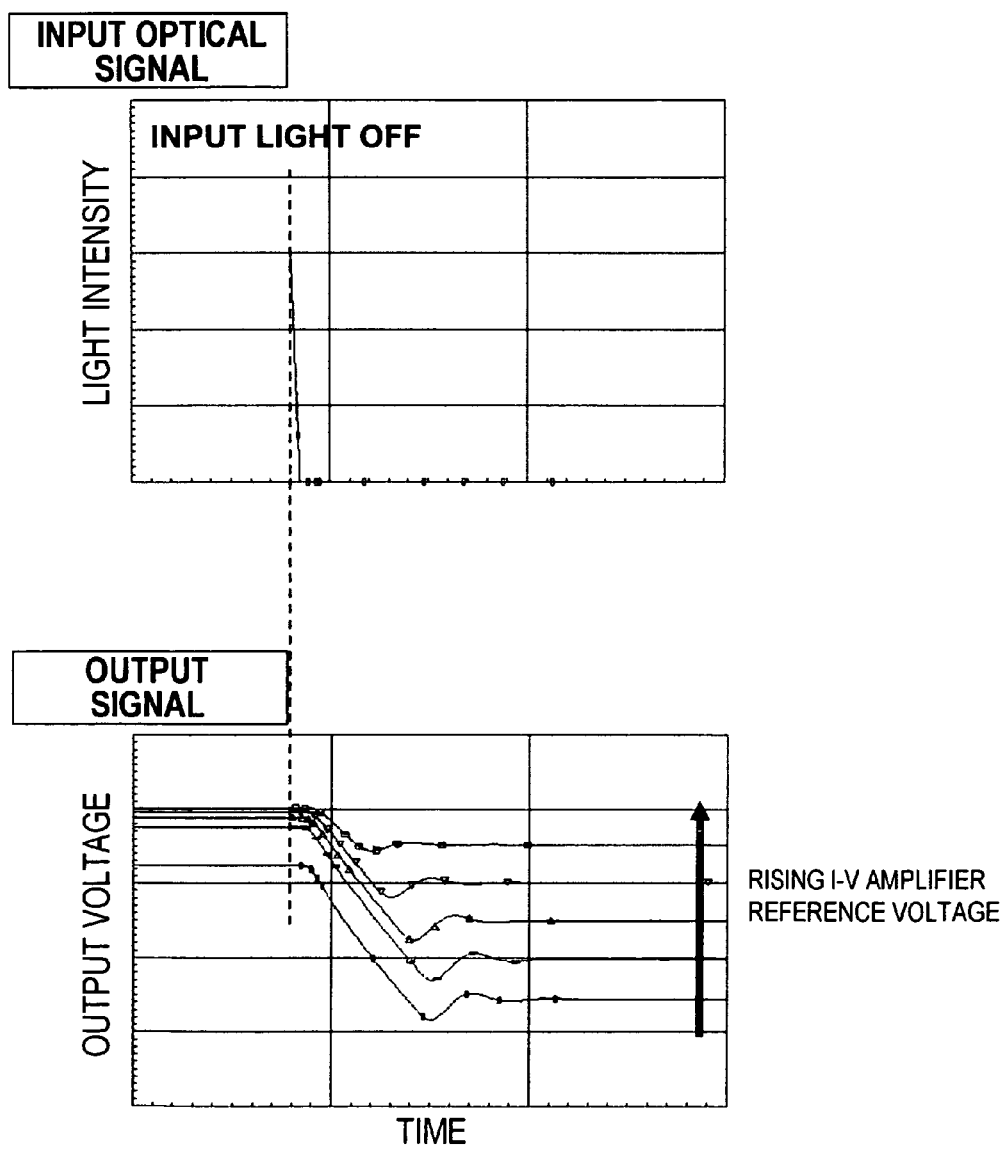
FIG. 3 is a diagram illustrating the output response characteristic of the light-receiving circuit according to the first exemplary embodiment.

FIG. 3 illustrates the pulse response characteristic at the time of output saturation. As illustrated in FIG. 3, a characteristic is obtained in which waveform delay is extremely small at the falling portion of the response waveform even if the reference voltage Vc is varied. Thus, the light-receiving circuit of this embodiment is such that by causing the transistor within the current-voltage converting circuit 13 to operate without being saturated, irrespective of the potential Vc at the reference voltage terminal 6, even if the optical input current 1 becomes excessive, it is possible to obtain an excellent restoration characteristic regarding restoration from a state in which strong light has been input to the circuit.

[Second Exemplary Embodiment]

Figure 4:
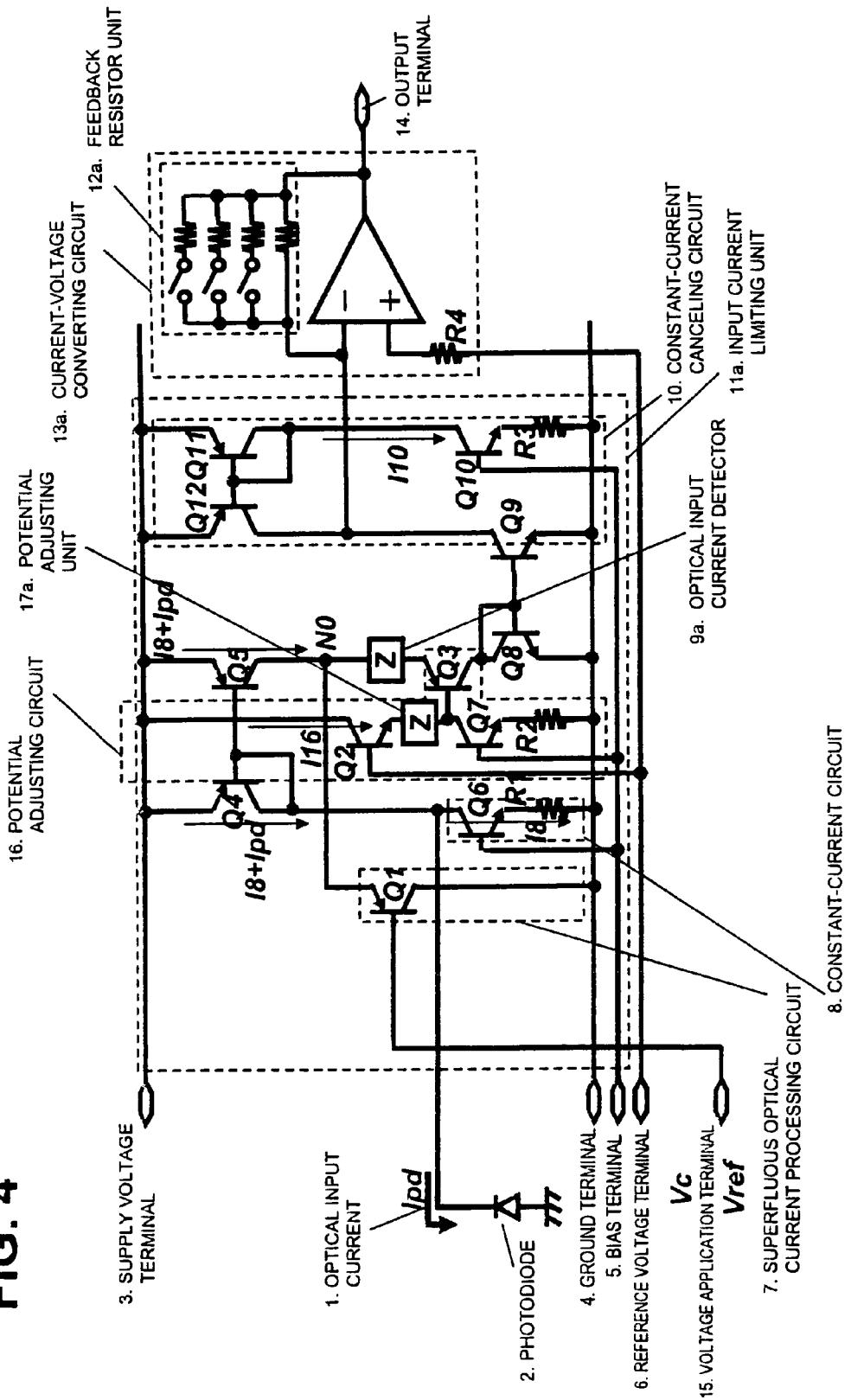
FIG. 4 is a circuit diagram of a light-receiving circuit according to a second exemplary embodiment of the present invention.
Figure 5:
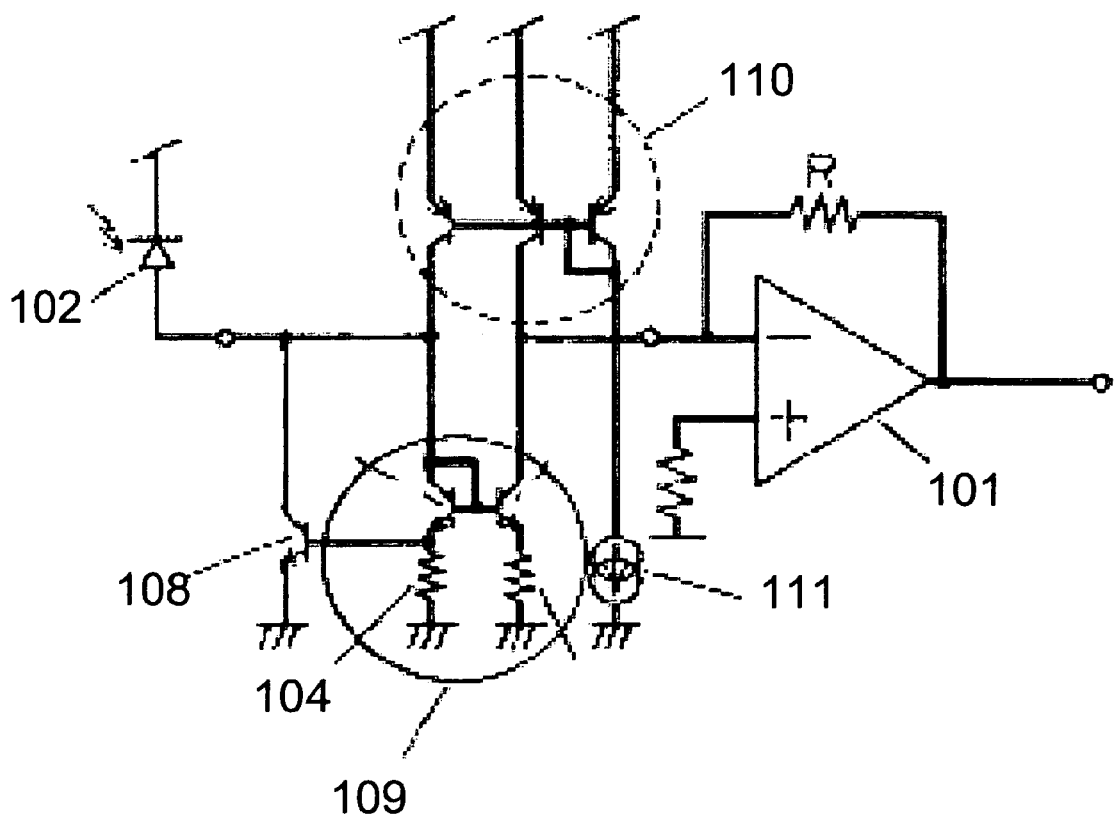
FIG. 5 is a circuit diagram of a current-voltage converting circuit according to the prior art.
Figure 6:
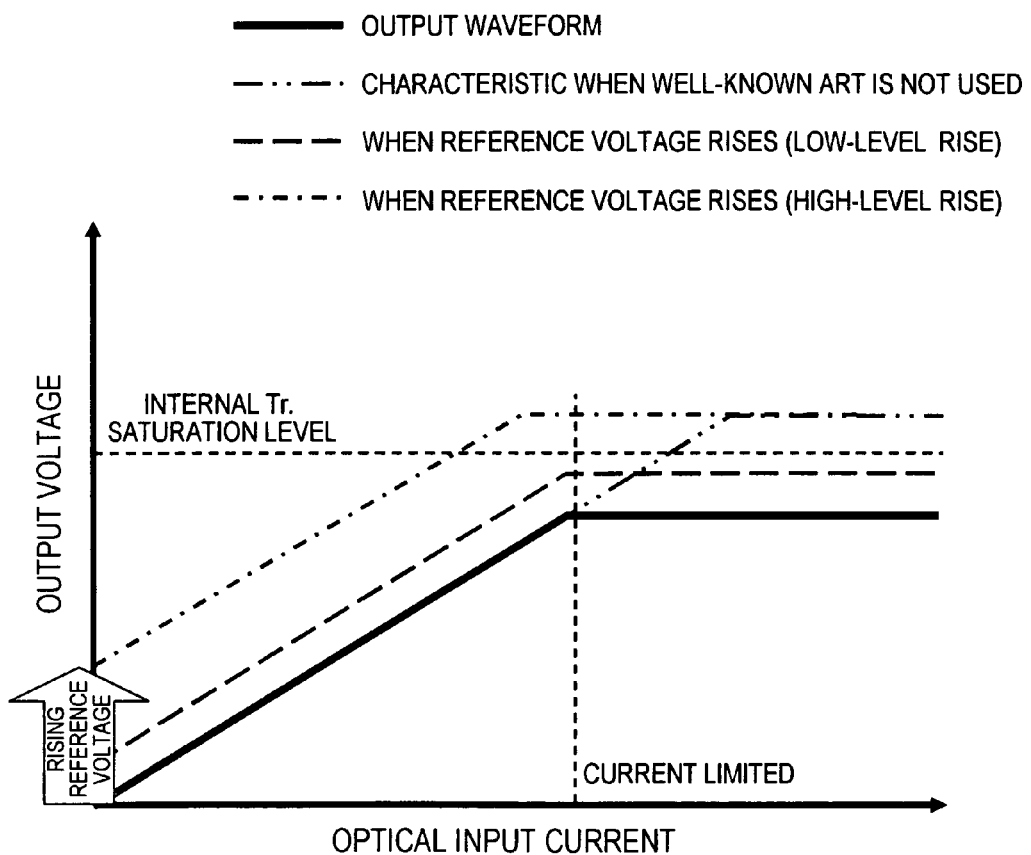
FIG. 6 is a diagram, as analyzed by the present inventors, illustrating the input/output characteristic of a light-receiving circuit according to the prior art.
Figure 7:
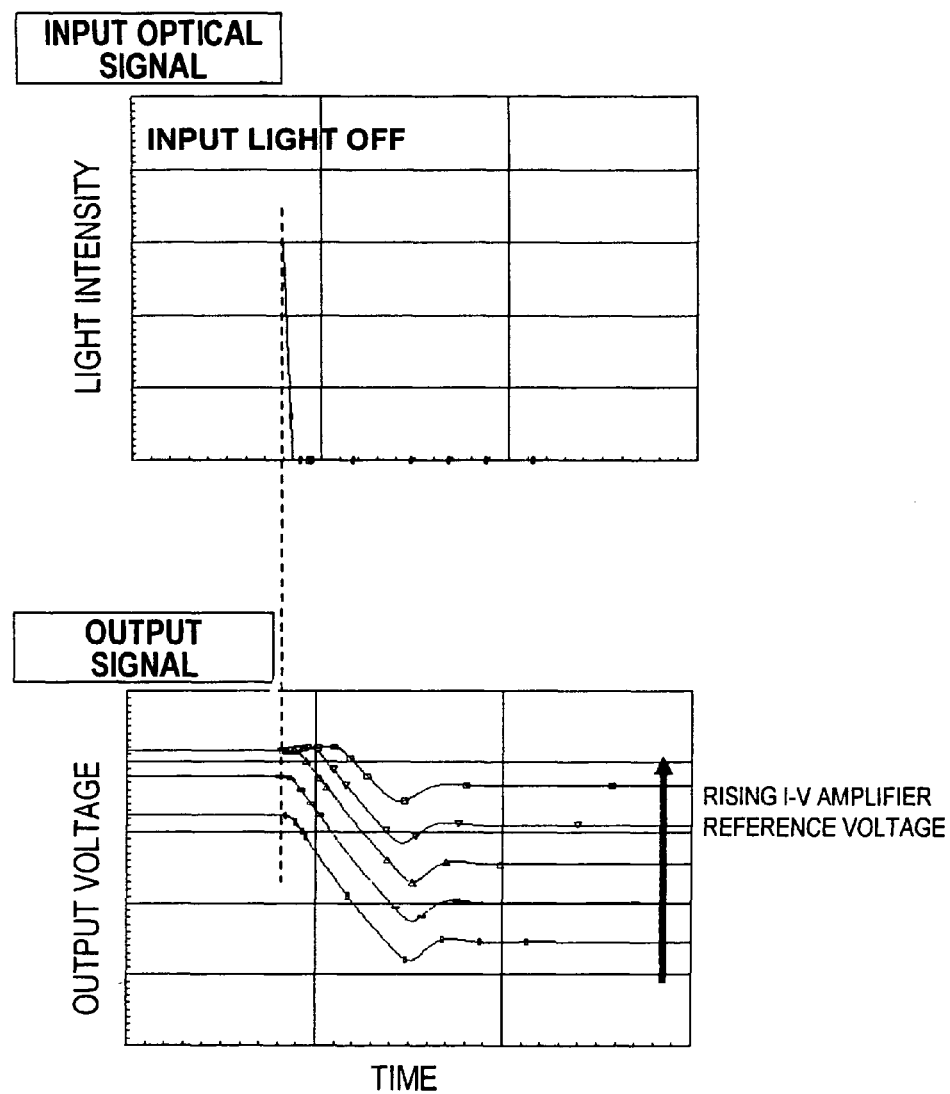
FIG. 7 is a diagram, as analyzed by the present inventors, illustrating the output response characteristic of the light-receiving circuit according to the prior art.

FIG. 4 is a circuit diagram of a light-receiving circuit according to a second exemplary embodiment of the present disclosure. Components in FIG. 4 identical with those shown in FIG. 1 are designated by like reference characters and need not be described again. The light-receiving circuit of the second exemplary embodiment has a feedback resistor unit 12a in place of the feedback resistor 12 of FIG. 1, an optical input current detector 9a in place of the optical input current detecting resistor 9, and a potential adjusting unit 17a in place of the potential adjusting resistor 17. The feedback resistor unit 12a, optical input current detector 9a and potential adjusting unit 17a are identical in structure and each is constituted by a plurality of parallel-connected resistance elements capable of being switched. A current-voltage converting circuit 13a has a multi-stage gain changeover function based upon changeover of the resistance value in the feedback resistor unit 12a.

In such a light-receiving circuit, by using a circuit having a structure identical with that of the feedback resistor unit 12a for the optical input current detector 9a and potential adjusting unit 17a, a function equivalent to that of the first exemplary embodiment can be obtained with respect to the gain of each.

The disclosure of patent document cited above is incorporated by reference in this specification. Within the bounds of the full disclosure of the present disclosure (inclusive of the scope of the claims), it is possible to modify and adjust the modes and embodiments of the invention based upon the fundamental technical idea of the invention. Multifarious combinations and selections of the various disclosed elements are possible within the bounds of the scope of the claims of the present disclosure. That is, it goes without saying that the invention covers various modifications and changes that would be obvious to those skilled in the art within the scope of the claims.

What is claimed is:

1. A light-receiving circuit comprising:
   a light-receiving element that converts an input optical signal to a current signal;
   a current-voltage converting circuit that outputs an output voltage signal obtained by adding a reference voltage to a voltage signal proportional to a current value of the current signal; and
   an input current limiting unit that supplies said current-voltage converting circuit with the current signal upon limiting the current value of this current signal based upon the reference voltage in such a manner that the output voltage signal will not exceed a constant value irrespective of a value of the reference voltage,
   wherein in a case where the current value of the current signal is equal to or greater than a limit value, said input current limiting unit limits the current value relating to the current signal, which is supplied to said current-voltage converting circuit, in such a manner that said current-voltage converting circuit will output a constant output voltage signal.

2. The light-receiving circuit according to claim 1, wherein said input current limiting unit includes:
   a first resistance element comprising a first end whose potential is decided by the reference voltage; and
   a second resistance element comprising a first end whose potential is decided by a potential at a second end of said first resistance element;
   wherein said input current limiting unit passes a constant current into said first resistance element, passes a current obtained by adding the current of the current signal to the constant current into said second resistance element and limits the current value of the current signal based upon whether the potential at a second end of said second resistance element has exceeded a prescribed potential.

3. The light-receiving circuit according to claim 2, wherein said input current limiting unit further includes a superfluous optical current processing circuit that compares a voltage at the second end of said second resistance element and a voltage relating to the limit current of the current signal, and diverts a superfluous amount of current that exceeds the limit on the current value of the current signal.

4. A semiconductor device comprising the light-receiving circuit set forth in claim 3.

5. The light-receiving circuit according to claim 2, wherein said current-voltage converting circuit includes a feedback resistance provided between an output end that outputs the output voltage signal and an input end to which the current signal that is output from said input current limiting unit is input,
   wherein said feedback resistance is adapted so as to make possible a changeover of a gain of said current-voltage converting circuit; and
   said input current limiting unit is adapted so as to change over resistance values of said first and second resistance elements in operative association with changeover of said feedback resistance.

6. A semiconductor device comprising the light-receiving circuit set forth in claim 5.

7. A semiconductor device comprising the light-receiving circuit set forth in claim 2.

8. The light-receiving circuit according to claim 1, wherein a limit value of the input current of the current-voltage converting circuit is linked to the reference voltage.

9. The light-receiving circuit according to claim 8, wherein an output voltage limit value is made a constant voltage regardless of a fluctuation of the reference voltage.

10. A semiconductor device comprising:
   A light-receiving circuit comprising:
      a light-receiving element that converts an input optical signal to a current signal;
      a current-voltage converting circuit that outputs an output voltage signal obtained by adding a reference voltage to a voltage signal proportional to a current value of the current signal; and
      an input current limiting unit that supplies said current-voltage converting circuit with the current signal upon limiting the current value of this current signal based upon the reference voltage in such a manner that the output voltage signal will not exceed a constant value irrespective of a value of the reference voltage,
      wherein in a case where the current value of the current signal is equal to or greater than a limit value, said input current limiting unit limits the current value relating to the current signal, which is supplied to said current-voltage converting circuit, in such a manner that said current-voltage converting circuit will output a constant output voltage signal.

* * * * *